United States Patent [19]

Omata

[11] Patent Number: 4,572,659
[45] Date of Patent: Feb. 25, 1986

[54] ILLUMINATING APPARATUS

[75] Inventor: Takashi Omata, Yokosuka, Japan

[73] Assignee: Canon Kabushiki Kaisha, Tokyo, Japan

[21] Appl. No.: 538,743

[22] Filed: Oct. 3, 1983

[30] Foreign Application Priority Data

Oct. 5, 1982 [JP] Japan .................. 57-175848

[51] Int. Cl.$^4$ .............................. G03B 27/54
[52] U.S. Cl. ................... 355/67; 350/319; 362/331; 362/328; 362/268; 362/335
[58] Field of Search ........... 355/71, 67, 57, 51; 350/505, 319; 362/321, 331, 328, 368, 335

[56] References Cited

U.S. PATENT DOCUMENTS

| 4,215,934 | 8/1980 | Karasawa | 355/51 |
| 4,294,538 | 10/1981 | Ban | 350/505 X |
| 4,362,384 | 12/1982 | Engelbrecht et al. | 355/71 |

Primary Examiner—L. T. Hix
Assistant Examiner—Brian W. Brown
Attorney, Agent, or Firm—Fitzpatrick, Cella, Harper & Scinto

[57] ABSTRACT

The present invention provides an illuminating apparatus for illuminating a surface to be illuminated by the use of an arcuate light source image. A point source of light is intermediately imaged in the form of an arcuate by a concave mirror. The arcuate intermediate light source image is further imaged on the surface, to be illuminated, by a plurality of concave mirrors to form an arcuate image. Convex and concave blades, which define an arcuate slit-shaped opening, are disposed in positions spaced away from each other forwardly and rearwardly of the intermediate light source image, respectively. By the use of these blades, a sharper light source image can finally be formed in the form of an arc.

4 Claims, 9 Drawing Figures

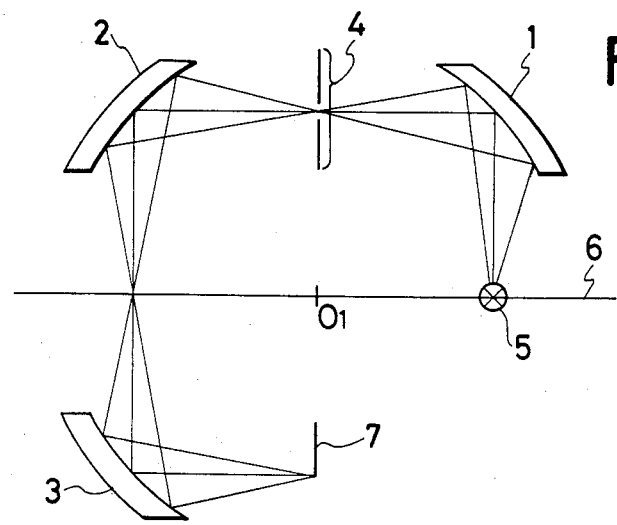
FIG.1
FIG.2
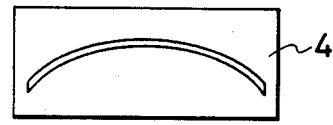
FIG.3
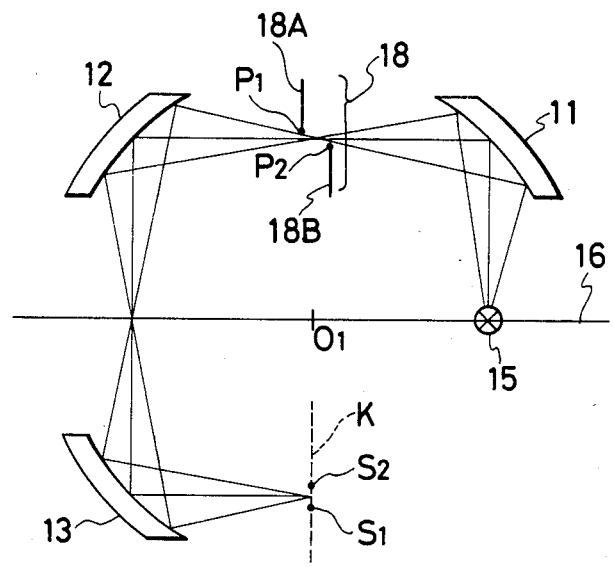

ILLUMINATING APPARATUS

BACKGROUND OF THE INVENTION

1. Field of the Invention

The present invention relates to an optical apparatus for effectively illuminating a surface of a predetermined shape, and, particularly, it relates to a mask illuminating system for use in an apparatus for printing the pattern of a semiconductor integrated circuit.

2. Description of the Prior Art

In recent systems for printing the fine pattern of an integrated circuit, a mirror projection optical system having the imaging magnification of one-to-one has been utilized. Such a mirror projection optical system has an arcuate slit-shaped superior imaging area. Thus, an illuminating optical system to be used when the printing of an integrated circuit pattern is carried out by the use of such mirror projection optical system must similarly illuminate the arcuate slit-shaped area more effectively. An illuminating optical system suitable for such a purpose in disclosed in U.S. Pat. No. 4,294,538, for example. As shown in FIG. 1 of the drawings attached to the subject specification, such illuminating optical system comprises three concave spherical mirrors 1, 2 and 3, the spherical centers of which are disclosed on a common optical axis 6. A slit plate 4 is positioned perpendicular to the optical axis 6 with the slit-like opening 4 being formed into an arcuate shape as seen from FIG. 2. A point source of light 5, which may be a super-pressure mercury lamp or the like, is located on the optical axis 6 such that the beam of light therefrom is reflected by the spherical mirror 1 and then converged at the opening of the slit plate 4 to form an arcuate light source image. After passing through the opening of the slit plate 4, the arcuate beam is returned to its original point form by the spherical mirror 2 and then reflected by the spherical mirror 3 to form a slit-like image 7. Such an optical system provides an effective and convenient means for utilizing a point source of light to form an arcuate slit-shaped illuminating area. However, due to the aberrations at the spherical mirrors 2 and 3, the image of the slit opening would be blurred. In order to ensure that the mirror projection optical system for printing the pattern operates at its maximum performance, it is necessary to suppress the occurrence of the image blur sufficiently.

SUMMARY OF THE INVENTION

It is an object of the present invention to provide a illuminating system using spherical mirror means, in which the occurrence of the image blur is sufficiently suppressed so that any subsequent system can be operated at its maximum performance.

Other objects and the features of the invention will be apparent from the following description.

BRIEF DESCRIPTION OF THE DRAWINGS

FIG. 1 is an optical cross-section of a prior art illuminating system;

FIG. 2 is a plan view of a light blocking plate provided with an arcuate slit-shape opening;

FIG. 3 is an optical cross-section of one embodiment according to the present invention;

DESCRIPTION OF THE PREFERRED EMBODIMENT

Now, the present invention will first be described in connection with the first embodiment thereof shown in FIG. 3.

Figure 4:
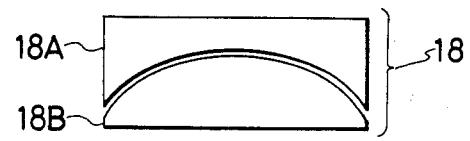
FIG. 4 is a view of a light blocking means according to the present invention as viewed along the optical axis.

An optical system is shown in FIG. 3 comprising three concave spherical mirrors 11, 12 and 13 having the same radius of curvature. These spherical mirrors are so arranged that the spherical centers thereof are at a point $O_1$ on a common optical axis 16. On the optical axis 16 there is also located a point source of light 15 which may be a super-pressure mercury lamp or the like. A light blocking means 18 is disposed between the spherical mirrors 11 and 12 to define an arcuate slit-like opening. The light blocking means 18 consists of an upper blade 18A having a concave edge and a lower blade 18B having a convex edge, these blades 18A and 18B defining such an arcuate slit in the direction of the optical axis as shown in FIG. 4 when they are positioned in place. The blades 18A and 18B are disposed in the planes which are spaced apart from each other and located forwardly and rearwardly of a position at which an image of the light source is formed by the spherical mirror 11, both the planes being perpendicular to the optical axis. The blade 18B having the convexed portion is located nearer to the light source and nearer to the optical axis, as compared with the other blade. Additionally, the upper and lower blades 18A and 18B are so disposed that the concave edge $P_1$ of the upper half 18A and 18B are so disposed that the concave edge $P_1$ of the upper half 18A is imaged on a point $S_1$ in a plane K perpendicular to the optical axis through the concave spherical mirrors 12 and 13 while the convex edge $P_2$ of the lower blade 18B is imaged on a point $S_2$ in the same plane K through the mirrors 12 and 13.

In the so constructed optical system, the beam of light from the point light source 5 is reflected by the concave spherical mirror 11 and thereby converged at the arcuate opening defined by the upper and lower blades 18A and 18B of the light blocking means 18. After passing through the arcuate slit, the beam is subsequently reflected by the concave spherical mirrors 12 and 13, providing a relay optical system, and is converged onto the plane K. In other words, the arcuate slit-like opening in the light blocking means 18 is imaged on the plane K. Since the edges $P_1$, $P_2$ of the upper and lower blades 18A, 18B are respectively imaged on the point $S_1$, $S_2$ in the same plane K as described hereinbefore, the blur of the images, on the plane K, of the respective edges $P_1$, $P_2$ is very minute.

Figure 5:
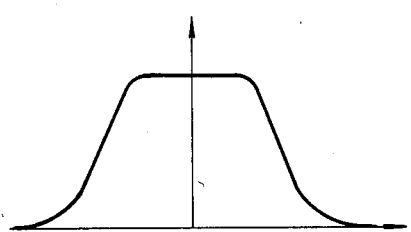
FIG. 5 shows the distribution of light according to the prior art.
Figure 6:
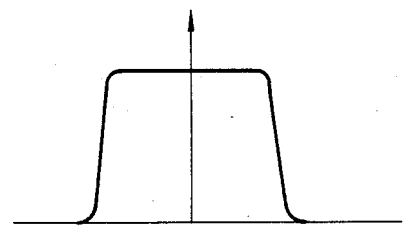
FIG. 6 shows the distribution of light according to the present invention.

FIG. 5 shows the distribution of light intensity on an imaging plane in the radial direction of an arcuate slit when the conventional slit plate as shown in FIG. 1 is used in an illuminating optical system. FIG. 6 shows the distribution of light intensity on the imaging plane K in the radial direction of the arcuate slit-shaped opening of the light blocking means 18. It is seen that the distribution of light intensity according to the present invention has sharp-cut edges, so that the blur is minimized.

Figure 7:
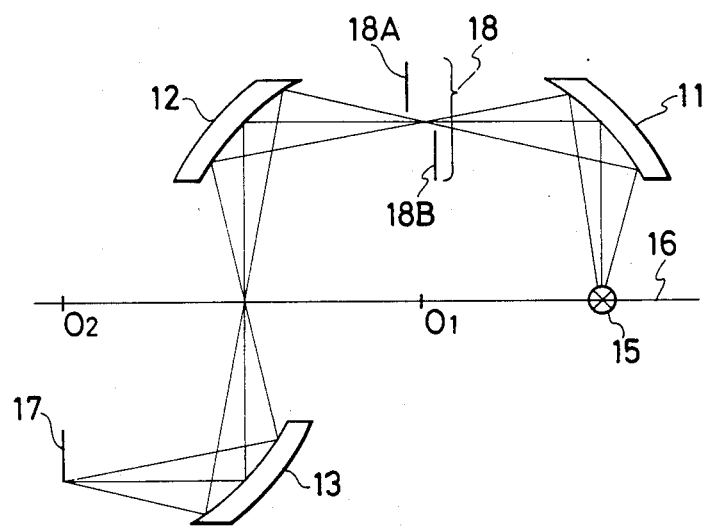
FIG. 7 is a view showing another embodiment of the present invention.

FIG. 7 shows another embodiment of the present invention in which the concave spherical mirror 13 is disposed in a orientation different from that of FIG. 3. The concave spherical mirror 13 has its center of sphere $O_2$ disposed on the optical axis 16 but spaced away from the center of sphere $O_1$ of the concave spherical mirrors 11 and 12. The spacing between the centers of sphere $O_1$ and $O_2$ is equal to $(R_1+R_2)/\sqrt{2}$ where $R_1$ and $R_2$ are the radii of curvature of the concave spherical mirrors 12 and 13, respectively. Even when the concave spherical mirror 13 is positioned as shown in FIG. 7, the arcuate slit-shape opening in the light blocking means 18 can be imaged as shown at 17 in FIG. 7. If the upper and lower blades 18A and 18B of the light blocking means 8 are located perpendicular to the optical axis and spaced away from each other in the similar manner as described hereinbefore, similar results are obtainable, so that a superior slit image 17 having minimized blur at the upper and lower edges can be formed. In the embodiment of FIG. 7, the slit image 17 is formed at a position remote from the light source 15 so that any mirror projection optical system to be associated with the illuminating optical system can be disposed in a position farther from the light source 15 to reduce any adverse affect due to the heat therefrom.

Figure 8:
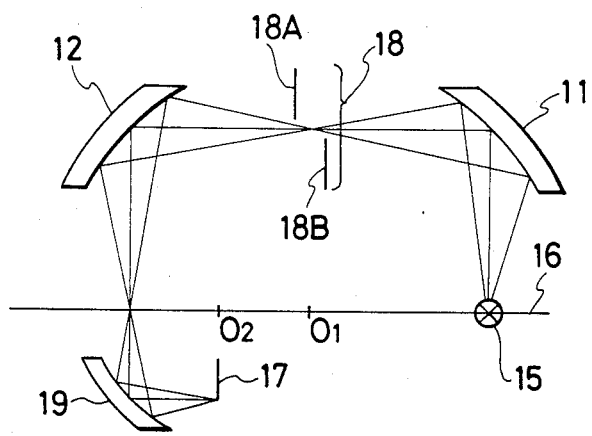
FIG. 8 is a view showing still another embodiment of the present invention.

FIG. 8 shows still another embodiment of the present invention in which a concave spherical mirror 19 is used in place of the concave spherical mirror 13 in the previous embodiments. The mirror 19 has a radius of curvature different from that of the concave spherical mirror 12. The center of sphere of the mirror 19 is at a point $O_2$ on the optical axis 16 spaced away from the common center of sphere of the mirrors 11 and 12 by a distance which can be represented by $|R_2-R_1|/\sqrt{2}$ where $R_2$ is the radius of curvature of the mirror 19 and $R_1$ is the radius of curvature of the respective mirrors 11 and 12. In this case, the ratio of slit image to slit-shaped opening with respect to their radii of curvature is $R_2/R_1$. This embodiment is effective where it is required to form a slit image having its radius of curvature different from that of the slit-shaped opening which has been determined by the radius of curvature in the concave spherical mirror 12. Even in the embodiment shown in FIG. 8, there is obtained the same advantage when the upper and lower blades 18A and 18B of the light blocking means 18 are spaced away from each other along the optical axis.

In the aforementioned embodiments of the present invention, the quality of image will not be reduced even when any flat mirrors are arranged to bend the optical path. Such flat mirrors will provide effective means for forming a slit image at any desired orientations and positions.

Figure 9:
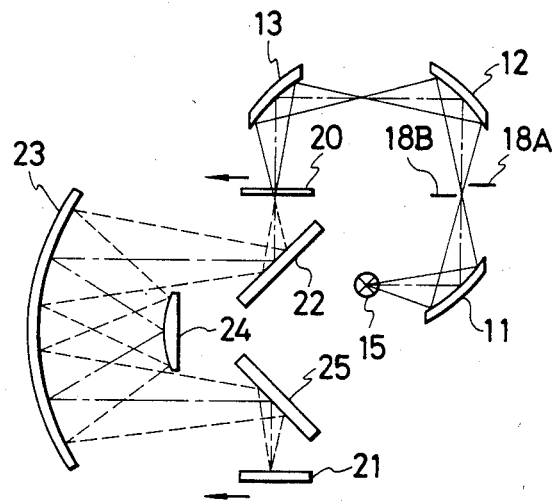
FIG. 9 is an optical cross-section of a semiconductor producing apparatus to which the principle of the present invention is applied.

FIG. 9 shows a semiconductor producing apparatus including an illuminating system according to the present invention. This illuminating system is similar to the aforementioned embodiment of the present invention and comprises a light source 15, concave spherical mirrors 11, 12 and 13, and light blocking means (18A, 18B) defining an arcuate slit-like opening. A mask 20 has formed thereon a pattern of an integrated circuit, and a wafer 21 has a photosensitive layer. Denoted by 22 and 25 are flat mirrors 22, 25 for bending the optical path, denoted by 23 is a concave spherical mirror, and denoted by 24 is a convex spherical mirror. The radius of the mirror 24 is a half of that of the mirror 23, and the centers of sphere of the mirrors 23 and 24 are spaced away from each other. The mask 20 and wafer 21 are simultaneously scanned in the direction of arrow.

In such an arrangement, the beam of light from the light source 15 is shaped by the light blocking blades 18A and 18B which form the arcuate slit-like opening, and then defines, on the mask 20, a clear arc-shaped surface region which is being illuminated, through the concave spherical mirrors 12 and 13. As the mask 20 is scanned, the surface of the mask is successively illuminated. After passing through the mask 20, the beam is reflected by the flat mirror 22 to the concave spherical mirror 23. By this concave spherical mirror 23, the beam is reflected toward the convex spherical mirror 24 while being subjected to the converging action of the mirror 23. The beam reflected form the convex spherical mirror 24 is again reflected by the concave spherical mirror 23 and then is reflected by the flat mirror 25 to continuously form a pattern image on the wafer 21. Due to the formation of definite surface region to be illuminated, the quality of image can be improved.

As described hereinbefore, the present invention ensures, with a very simple construction, improvements in the quality of illumination onto the surface and further improvements in the characteristics of any subsequent system.

I claim:

1. An apparatus for illuminating a surface to be illuminated, with an arcuate light source image, said apparatus comprising:
    means for providing a point source of light;
    an imaging optical system for imaging said point source of light as an arcuate image, said imaging optical system including concave mirror means;
    a relay imaging optical system for re-imaging said arcuate light source image on the surface to be illuminated, said relay imaging optical system concave mirror means; and
    an arcuate opening means including a first member having a concave edge and a second member having a convex edge, said second member being located nearer to said point source of light as compared with said first member and said first member being located nearer to said relay imaging optical system as compared with said second member.

2. An apparatus as defined in claim 1, wherein said concave mirror means of said imaging optical system comprises a first spherical mirror and said concave mirror means of said relay imaging optical system comprises second and third spherical mirrors, said first, second and third spherical mirrors being so arranged that the spherical centers thereof are at a point on a common optical axis on which said point source of light is located.

3. An apparatus as defined in claim 1, wherein said concave mirror means of said imaging optical system comprises a first spherical mirror, said concave mirror means of said relay imaging optical system comprises second and third spherical mirrors, said first, second and third spherical mirrors are so arranged that the spherical centers of the former two are at one point and the spherical center of the latter one is at another point, said two points being disposed on a common optical axis on which said point source of light is located but being spaced away from each other, and the spacing between said two points is equal to $(R_1+R_2)/\sqrt{2}$ where $R_1$ and $R_2$ are the radii of curvature of said second and third spherical mirrors, respectively.

4. An apparatus as defined in claim 1, wherein said concave mirror means of said imaging optical system comprises a first spherical mirror, said concave mirror means of said relay imaging optical system comprises second and third spherical mirrors, said first, second and third spherical mirrors are so arranged that the spherical centers of the former two are at one point and the spherical center of the latter one is at another point, said two points being disposed on a common optical axis on which said point source of light is located but being spaced away from each other, and the spacing between said two points is equal to $(R_1 - R_2)/\sqrt{2}$ where $R_1$ and $R_2$ are the radii of curvature of said second and third spherical mirrors, respectively.

* * * * *

UNITED STATES PATENT AND TRADEMARK OFFICE
CERTIFICATE OF CORRECTION

PATENT NO. : 4,572,659

DATED : February 25, 1986

INVENTOR(S) : Omata

It is certified that error appears in the above-identified patent and that said Letters Patent is hereby corrected as shown below:

Column 1, line 26-27, change "dis-/closed" to --disposed--.

Column 2, line 37, change "convexed" to --convex--; and
        line 48, change "so constructed" to --so-constructed--.

Column 3, line 28, change "affect" to --effect--.

Column 4, line 39-40, change "system con-/cave mirror means" to --system including concave mirror means--.

Signed and Sealed this

Twentieth Day of January, 1987

Attest:

DONALD J. QUIGG

*Attesting Officer*    *Commissioner of Patents and Trademarks*